US008365111B2

(12) United States Patent
Chen et al.

(10) Patent No.: US 8,365,111 B2
(45) Date of Patent: Jan. 29, 2013

(54) DATA DRIVEN LOGIC SIMULATION

(75) Inventors: Fei Chen, Austin, TX (US); Guang R. Gao, Newark, DE (US)

(73) Assignee: ET International, Inc., Newark, DE (US)

( * ) Notice: Subject to any disclaimer, the term of this patent is extended or adjusted under 35 U.S.C. 154(b) by 622 days.

(21) Appl. No.: 12/392,666

(22) Filed: Feb. 25, 2009

(65) Prior Publication Data

US 2009/0222252 A1 Sep. 3, 2009

Related U.S. Application Data

(60) Provisional application No. 61/032,626, filed on Feb. 29, 2008.

(51) Int. Cl.
*G06F 17/50* (2006.01)
*G06G 7/62* (2006.01)

(52) U.S. Cl. ........ 716/106; 716/108; 716/111; 716/117; 716/132; 703/13; 703/14; 703/15

(58) Field of Classification Search .................. None
See application file for complete search history.

(56) References Cited

U.S. PATENT DOCUMENTS

| | | | | |
|---|---|---|---|---|
| 5,452,227 A | * | 9/1995 | Kelsey et al. | 716/103 |
| 5,526,278 A | * | 6/1996 | Powell | 716/55 |
| 6,078,736 A | * | 6/2000 | Guccione | 716/117 |
| 6,216,259 B1 | * | 4/2001 | Guccione et al. | 716/117 |
| 7,024,654 B2 | * | 4/2006 | Bersch et al. | 716/117 |
| 7,221,649 B2 | * | 5/2007 | Chen et al. | 370/235 |
| 7,284,210 B2 | * | 10/2007 | Baumgartner et al. | 716/103 |
| 7,380,219 B1 | * | 5/2008 | Barras et al. | 716/104 |
| 7,631,305 B2 | * | 12/2009 | Rong et al. | 717/161 |
| 7,934,179 B2 | * | 4/2011 | Gao et al. | 716/100 |
| 2003/0229877 A1 | * | 12/2003 | Bersch et al. | 716/16 |
| 2004/0044514 A1 | * | 3/2004 | Granny et al. | 703/23 |
| 2010/0122105 A1 | * | 5/2010 | Arslan et al. | 713/500 |

OTHER PUBLICATIONS

Antti Evesti et al., A Tool Chain for Quality-driven Software Architecting, 12th International Software Product Line Conference, p. 360, Sep. 2008.*
Suet-Fei Li et al., Configuration Code Generation and Optimizations for Heterogeneous Reconfigurable DSPs, Proceedings of the 1999 IEEE Workshop on Signal Processing Systems, pp. 169-180, 1999.*

* cited by examiner

*Primary Examiner* — A. M. Thompson
(74) *Attorney, Agent, or Firm* — Connolly Bove Lodge & Hutz LLP (57) ABSTRACT

An apparatus and method may be used for compiling a hardware logic design into data-driven logic programs to be executed on a data-driven chip. The apparatus may include storage with a library for defining a net-list synthesized by a synthesis tool. The apparatus may also include a data-driven logic verification chip comprising a plurality of logic processors. The apparatus may further include a code generator for adopting heuristics to convert the net-list into data driven logic programs and for allocating hardware resources to balance computing and storage loads across the plurality of logic processors of the verification chip.

17 Claims, 8 Drawing Sheets

DATA DRIVEN LOGIC SIMULATION

CROSS-REFERENCE TO RELATED APPLICATIONS

This application claims the benefit of U.S. Provisional Patent Application No. 61/032,626 filed on Feb. 29, 2008, which is hereby incorporated by reference.

FIELD OF THE INVENTION

Embodiments of the present invention may be directed to chip architecture for data-driven logic simulation and/or to a software tool-chain for compiling a hardware logic design into data-driven logic programs to be executed on a data-driven chip.

BACKGROUND

Traditionally, logic verification that is done on cycle-based simulators plays an important role in the process of chip development. Currently available cycle-based simulators may be categorized into two classes: event-driven work-station based simulation software and specially designed hardware simulation acceleration engine. The pure software approach is inefficient for larger verification targets because of software overhead and slow inter-workstation communication links. Existing hardware simulation acceleration engines are not just expensive to construct and maintain, but they are also inefficient in the sense that they do not utilize the intrinsic characteristic of hardware behavior—data-driven execution.

Current verification technology is mostly based on the field-programmable gate arrays (FPGAs), a cluster of personal computers (PCs), or specially designed application-specific integrated circuit (ASIC) systems. As is known in the art, FPGAs may be used to implement any logical function that an ASIC could perform, but the ability to update the functionality after shipping offers advantages for many applications. Current FPGA based verification technologies usually try to directly map target logic into a group of FPGAs and emulate a target system. This approach is not scalable and can become extremely expensive in constructing FPGAs as the complexity of the target logic increases. Also, the synthesizing processes normally take a long time, which makes this approach very inefficient at the early stages of the chip logic development when design changes occur very often. Furthermore, FPGAs are intrinsically much slower than custom designed circuits.

An alternative verification technology may use a cluster of personal computers (PCs). The biggest problem associated with simulating complex chip logic on a PC cluster is low performance. Hindering factors in using the PC cluster may come from bad instruction and data cache locality, inefficient communication channel, and operating system overhead.

Another alternative verification technology may use ASIC systems. For example, some big companies have developed dedicated logic simulation machines with specially designed ASICs to accelerate the logic simulation process. These systems are usually extremely expensive to develop and upgrade, and they are less programmable than other types of systems. The existing machines are also rarely commercially available to outside users.

SUMMARY OF EMBODIMENTS OF THE INVENTION

Various embodiments of the present invention may be directed to an apparatus and/or method for compiling a hardware logic design into data-driven logic programs to be executed on a data-driven chip. The apparatus may include storage with a library for defining a net-list synthesized by a synthesis tool. The apparatus may also include a data-driven logic verification chip that may comprise a plurality of logic processors. The apparatus may further include a code generator for adopting heuristics to convert the net-list into data driven logic programs and/or for allocating hardware resources to balance computing and storage loads across the plurality of logic processors of the verification chip.

Another embodiment of the invention may address an apparatus including a plurality of logic simulation engines. The apparatus may also include an Input/Output (I/O) glue unit and a simulation control unit for loading logic instructions into the plurality of logic simulation engines and at least one memory controller for attaching external storage. The apparatus may further include an array simulation unit for handling array simulation requests initiated from the plurality of logic simulation engines and/or for issuing input/output instructions to off-chip storage units including simulated arrays. The apparatus may also include an interchip communication unit for handling communication requests between logic verification chips.

Another embodiment of the invention may involve a method for defining a set of primitive logic operations upon which a net-list can be built and for synthesizing logic design sources into the net-list. The method may also include converting the net-list into data driven logic instructions and loading the logic instructions into logic simulation engines in a verification chip. The method may further include routing data packets to a specific logic simulation engine and executing the logic instructions in the logic simulation engine on the routed data packets.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention, wherein.

DETAILED DESCRIPTION OF EMBODIMENTS OF THE INVENTION

Embodiments of the present invention that may be applied to an apparatus and/or method for efficiently compiling a hardware logic design into data-driven logic programs to be executed on a data-driven chip are described below. It should be apparent to one skilled in the art that the present invention is not limited to the embodiments described below.

Figure 1:
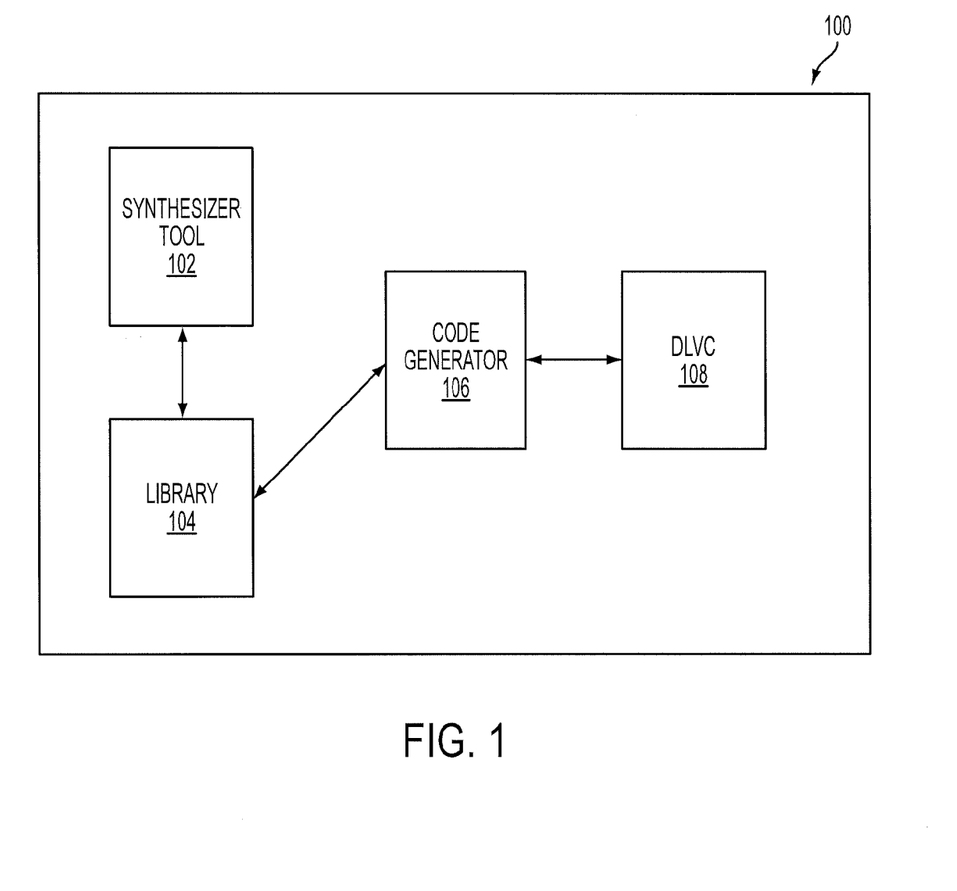
FIG. 1 illustrates an embodiment of an apparatus that may be used for data-driven logic simulation.

FIG. 1 illustrates an embodiment of an apparatus 100 for data-driven logic simulation. Logic design sources may be synthesized by industry standard synthesis tools 102 into a net-list that may be composed by a set of primitive gates, latches and memory units, which may be defined in a generic technology independent library 104. Examples of logic design sources may include Very High Speed Integrated Circuit Hardware (VHDL) or Verilog. Library 104 may be defined in such a way that the primitive gates can be efficiently implemented by logic instructions and executed by logic processors. An embodiment of the present invention may also include a data-driven logic verification chip (DLVC) 108 architecture that may be scalable, efficient, and powerful in debugging support. To bridge the net-list output of the synthesizer 104 and the data-driven simulation chip 108, a data-driven code generator 106 may be used to adopt heuristics to convert the net-list into data-driven logic programs and to allocate hardware resources to balance both computing and storage loads across all logic processors in DLVC 108.

Library 104 may define a set of primitive logic operations upon which the net-list can be built by the synthesis tool 102. These primitive logic cells and their properties may be chosen so that they can be easily mapped to logic instructions and efficiently executed by logic processors in DLVC 108. In an embodiment of the invention, a primitive logic cell may accept up to four inputs, but the invention is not thus limited. Each of the inputs and the output of the primitive logic cell may typically be a 1-bit wide signal. The net-list generated by a synthesis tool 102 may include millions of primitive cells.

In addition to the 1-bit output primitive cells, library 102 may also include array primitives, also called memory blocks. The array primitives can have variable depth, data width, and address width. The number of read and write ports can also be configurable, and any of the write ports can be masked or not masked. The array parameters can be decided while the target logic design is being synthesized. In an embodiment of the invention, the arrays may not necessarily be treated as normal logic units and may be implemented with logic cells, in order to reduce cost and avoid running out of hardware resources.

Figure 2:
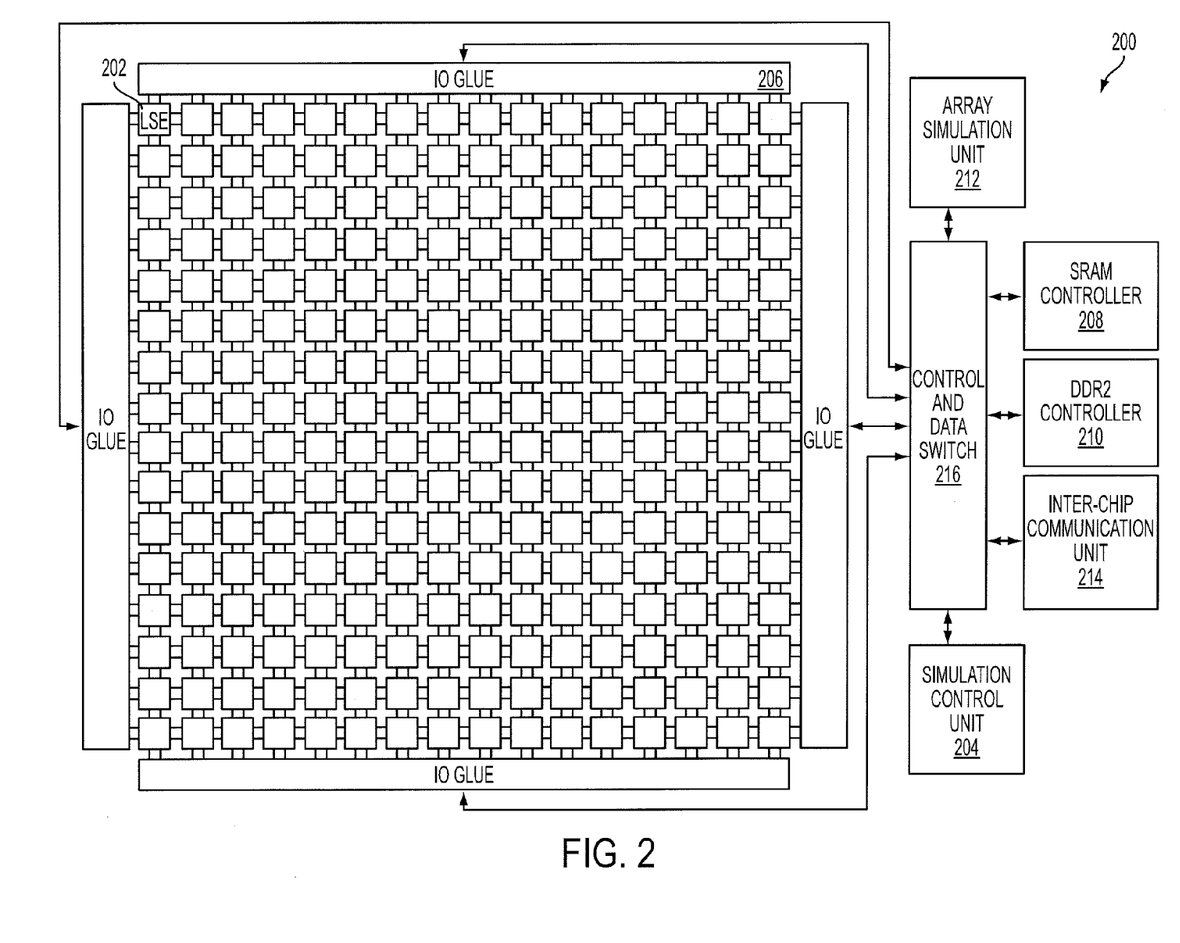
FIG. 2 illustrates an embodiment of a data-driven logic verification chip architecture.

FIG. 2 illustrates an embodiment 200 of the DLVC 108. An embodiment of DLVC 108 may include 256 Logic Simulation Engines (LSEs) 202 that may be arranged as a 16×16 mesh network, as shown in FIG. 2. Logic instructions may be loaded into LSEs 202 through a simulation control unit 204 and an input/output (I/O) Glue logic unit 206. Data packets may be routed to a specific LSE 202 in the two-dimensional mesh network by an X->Y routing protocol, described below. DLVC 108 may include built-in SRAM and DDR2 controllers 208 and 210 so that a considerable amount of external storage can be attached to the system. An array simulation unit 212 may be used to handle all array simulation requests initiated from the LSEs 202, and it may issue read and/or write commands to off-chip SRAM and/or DRAM units (not shown) in which the data of simulated arrays may be stored. An inter-chip communication unit 214 may be used to handle communication requests from one DLVC to another. There may be direct physical connections between two inter-chip communication units 214 at the adjacent DLVCs 108, and the overhead of inter-chip communication may be minimized when a logic verification system is constructed with multiple DLVCs. Simulation control unit 204 may be used to handle simulation start/stop commands, debugging requests, clock updates, and other control functionalities. Control and data switch 216 may be used to coordinate the traffic of control and data flow among the various components to which it is connected.

Figure 3:
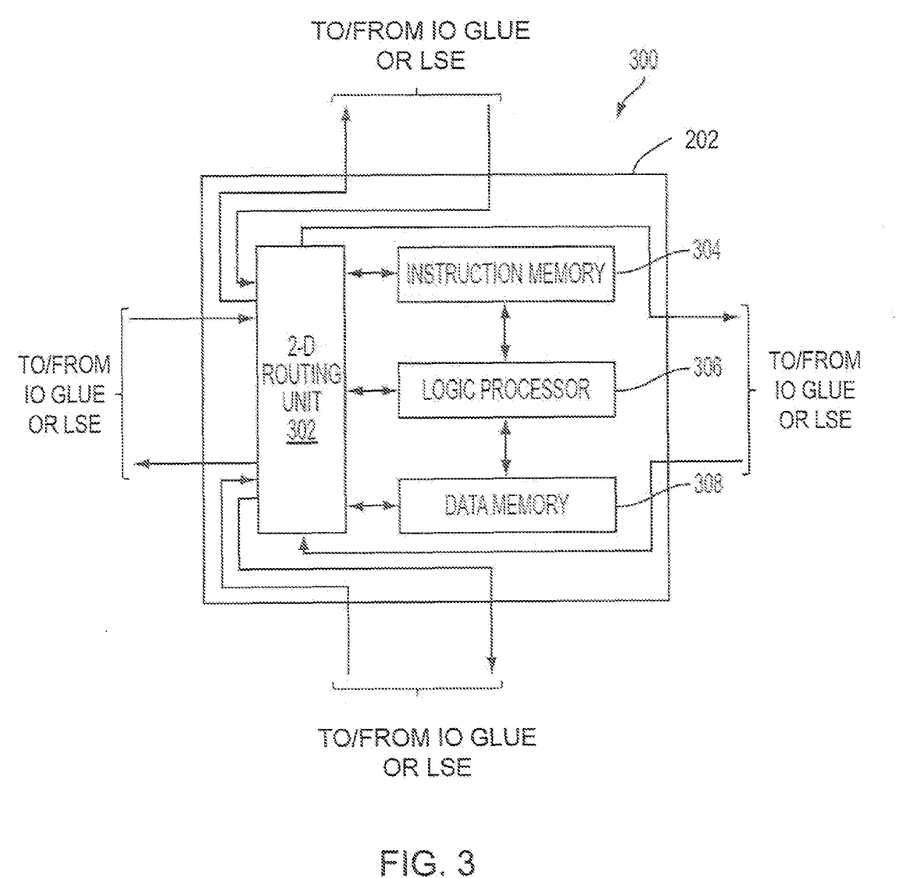
FIG. 3 illustrates an embodiment of the internal structure of an embodiment of a logic simulation engine.

FIG. 3 illustrates an embodiment of the internal structure 300 of LSE 202. A 2-D routing unit 302 may move data into and out of a LSE 202. It may also relay traffic that only passes by LSE 202. The routing algorithm used in 2-D routing unit 302 may be a simple X->Y routing protocol. The header of the routed packet may include offsets in both the X and Y directions. According to such an X->Y routing protocol, the packet reaches its destination when both offsets are zeros. An instruction memory 304 may be used to store the logic instructions.

A logic design can be treated as a Direct Acyclic Graph (DAG). In an embodiment of the invention, a predefined number of neighboring 1-bit primitive cells may be grouped into a sub-graph and may be treated as an atomic execution unit. The instructions from a single sub-graph may be stored in a continuous memory block in a bundle, and instruction memory 304 may be used to hold many of these kinds of bundles. The information about the starting address and length of these bundles may be stored somewhere else in a logic processor 306. LSE 202 may also include a data memory 308 where the values of the signals may be stored. For every sub-graph bundle, the inputs and outputs may have unique addresses in data memory 308. The internal combinatorial signals in a sub-graph may share some of the data memory addresses, depending on how the logic instructions in the sub-graph bundle are scheduled. Latch bits may also be double buffered in data memory 308.

Figure 4:
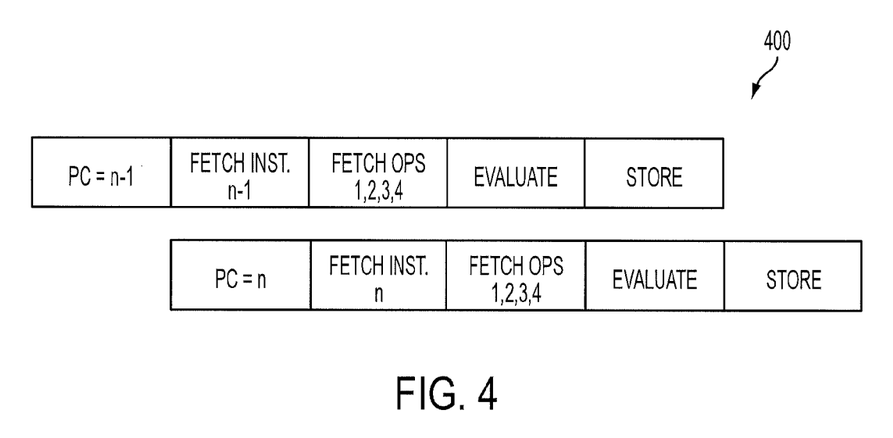
FIG. 4 illustrates an embodiment of pipelined stages of a logic processor.

A logic processor 306 may handle triggering events originated either remotely from logic processors 306 in other LSEs or locally from itself. Whenever a sub-graph bundle is in "active" state, logic processor 306 may then execute all the logic instructions in it and may check the output signals to see if any of them have changed after the execution. If the output signals have changed, triggering signals may be sent out to corresponding logic processors 306 in other LSEs, and/or locally to the same logic processor 306. Logic processor 306 may be fully pipelined into 5 stages 400, as shown in FIG. 4. The data memory may have four read ports and one write port. Logic processor 306 may execute one logic instruction every cycle unless there is an external triggering message coming in and competing for the write port of data memory 308.

Figure 5:
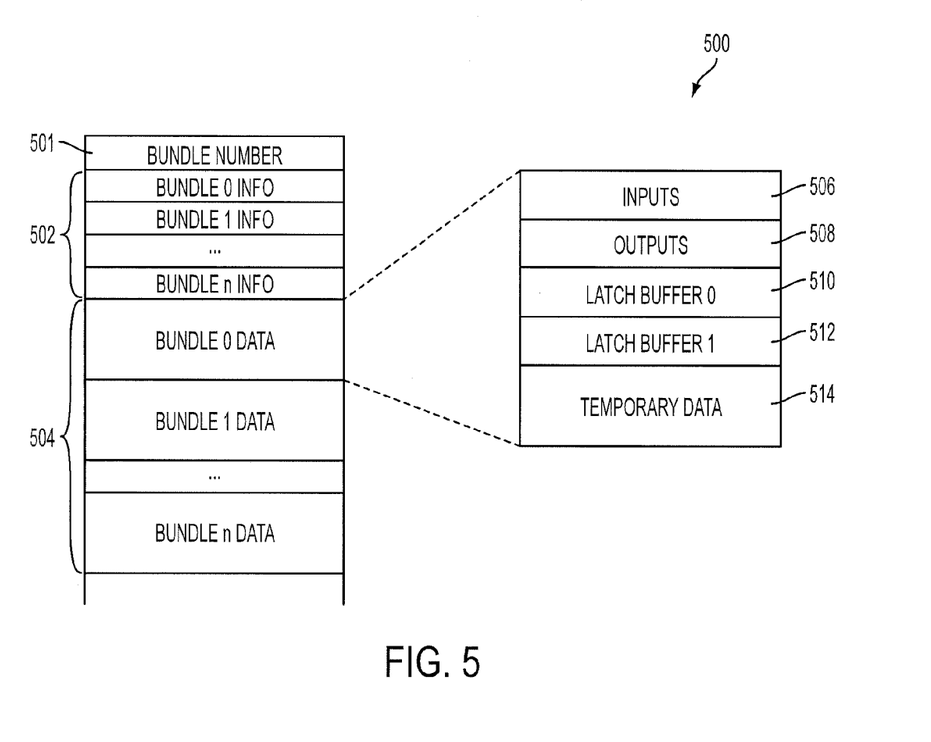
FIG. 5 illustrates an embodiment of a memory layout of a data memory.

FIG. 5 illustrates an exemplary embodiment of a memory layout 500 of data memory 308. At the very beginning of data memory 308 as shown in the example of FIG. 5 (to which the invention is not necessarily limited), there may be the bundle number 501, which represents the number of the sub-graph bundles assigned to one LSE 202. Bundle "n" information section, illustrated as one field in section 502, may record the starting address and the length of the logic instructions of the $n^{th}$ bundle, where "n" is greater than or equal to zero. It may also record whether the current state of the bundle is active or inactive. Logic processor 306 may constantly check the state bit associated with the bundle information memory and may execute a bundle if it is active. Bundle "n" data section, illustrated as one field in section 504, may include inputs 506, outputs 508, double buffered latches 510 and 512, and temporary data 514. Every triggering message may change the inputs 506 within a bundle data section and may set the state bit to "active" in the bundle information section. After logic processor 308 finishes all the logic instructions in the bundle, it may switch the state bit in the bundle information section back to "inactive" and may send out a triggering message if any of the outputs of the bundle data section have changed.

When logic instructions are generated by code generator 106, a heuristic register allocation algorithm may reuse the memory bits in temporary data section 514 for the combinatorial signals in the bundle. The execution of logic processor 306 may be interrupted when any of the inputs of the bundle being executed has been changed by a newly arrived external triggering message. Logic processor 306 may be configured to go immediately back to the first logic instruction of the bundle and start the execution over again.

Figure 6A:
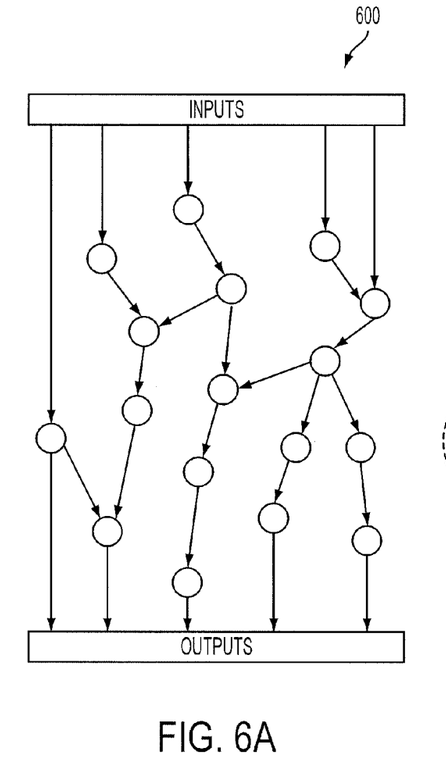
FIGS. 6A and 6B illustrate embodiments of Direct Acyclic Graphs.

As noted above, a logic design can be treated as a Direct Acyclic Graph (DAG). After the Register Transfer Level (RTL) design sources, such as VHDL or Verilog, are synthesized based on library 104, the corresponding DAG may be composed by millions of 1-bit primitive cells. FIG. 6A illustrates an example of DAG 600. In theory, one may map every node in the graph into a logic instruction and treat each one of them as a data-driven execution unit. But in reality, such mapping may require significant software and hardware overhead to implement the triggering mechanism for every single bit operation.

Figure 6B:
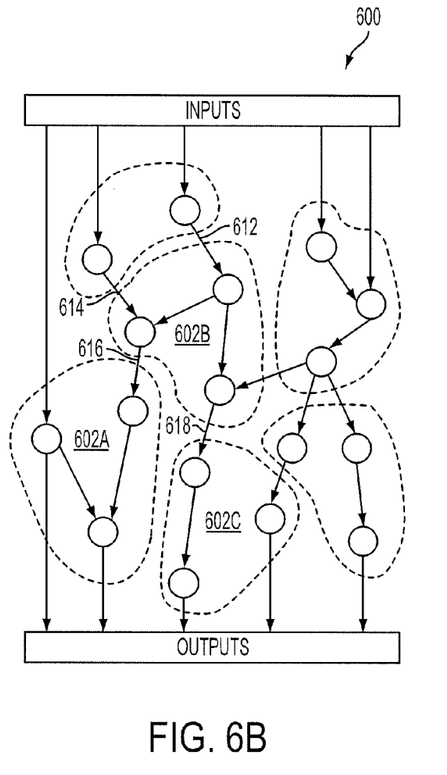

An embodiment of the present invention, therefore, may apply a data-driven execution scheme to logic cell bundles, as illustrated in FIG. 6B. In particular, neighboring nodes may be grouped together in the DAG 600 and may be treated as an atomic execution unit, called a logic cell bundle shown as 602. A logic cell bundle, for example 602B, may be triggered by the external outputs which are the edges, for example 612 and 614, directed into the logic cell bundle 602B in the graph. Logic cell bundle 602B may also trigger other logic cell bundles, for example 602A and 602C, if its outputs which are the edges directed out of the logic cell bundle, for example 616 and 618, have changed after an atomic execution.

There are many ways in which the DAG can be partitioned into many bundles. Constraints may be applied to generate a partition that is applicable to a particular data-driven execution style. According to an embodiment of the invention, first, one may set an upper limit of the number of the nodes that can be grouped into the same bundle. Too many nodes in the same bundle may make logic processor 306 execute logic instructions that may not be required to be executed if the logic cell bundle has a smaller number of logic instructions. Larger logic cell bundles may also have a higher probability of being triggered because they may tend to have more inputs. On the other hand, because of the synchronization overhead, one does not want to have too few nodes in the logic cell bundle either. The aforementioned upper limit may, therefore, be set based on balancing these considerations.

Another constraint of graph partitioning may be the number of the edges between neighboring bundles. To reduce the number of potential triggering across logic cell bundles, an embodiment of the present invention may minimize the number of edge-cuts while partitioning the graph. The amount of potential triggering across logic cell bundles may have a big impact on the efficiency of the data-driven execution. A degree to which the edges may be limited may be determined such that communication between neighboring bundles may be minimized while providing sufficient concurrency to ensure fast and parallel simulation. A number of graph partitioning algorithms following these constraints may be used in implementing embodiments of the present invention.

As previously noted, the logic cell bundle execution may be interruptible when any of its inputs is triggered while the logic cell bundle is being executed. The response to such interruption may be to start executing the first logic instruction in the logic cell bundle. One purpose of this interruptible execution may be to avoid unnecessary repetitive execution of the logic instructions.

Another embodiment of the invention, applying data-driven execution at the logic instruction bundle level, may result in greater efficiency in the use of data memory 308. If the size of the logic cell bundle is scaled down to just one logic instruction, the inputs and the output of every node in the DAG may be buffered with unique addresses in data memory 308. This may require a huge number of bits dedicated to buffer every single edge in a DAG composed by millions of nodes. Sometimes, the on-chip memory may not be big enough to hold these many signals. In the case of bundled execution as provided in embodiments of the present invention, the internal edges in the logic cell bundle may not need to occupy their own memory space in data memory 308 because they may not be visible outside the logic cell bundle. A scheduling algorithm may be applied to let the internal edges of a logic cell bundle share a small number of memory bits of data memory 308. This may then increase the capacity of the DLVC and may allow bigger target logic to be simulated with limited on-chip memory resource.

Figure 7:
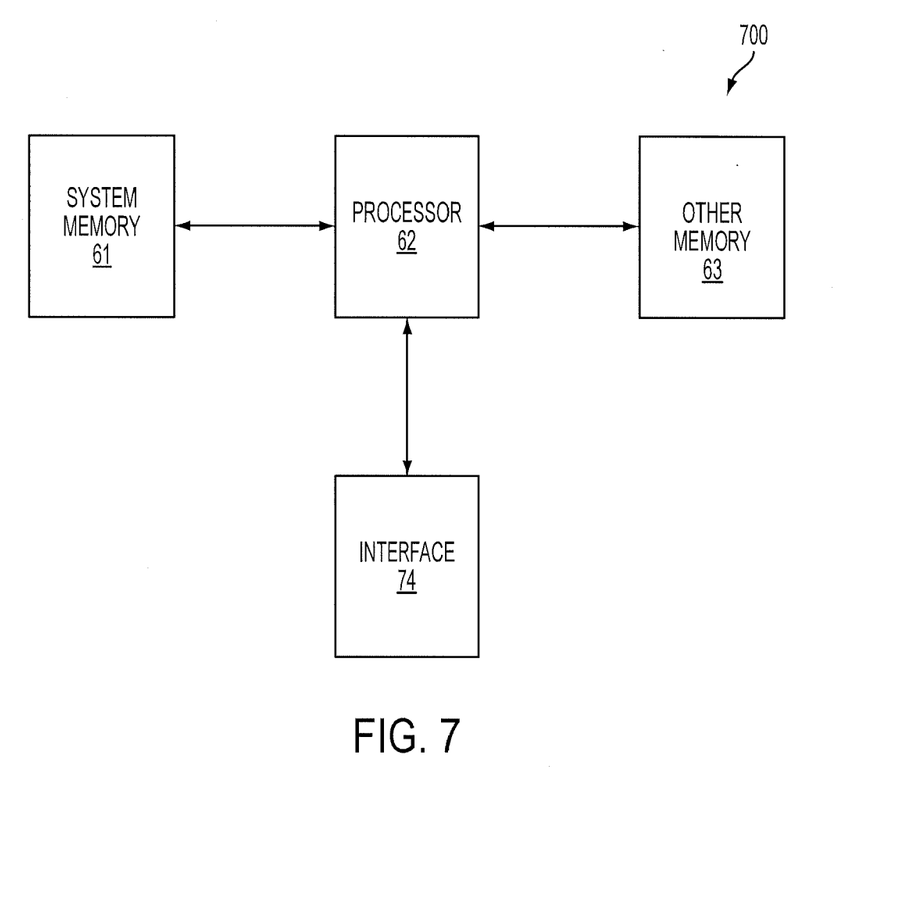
FIG. 7 illustrates an embodiment of an exemplary system that may be used to implement various forms and/or portions of embodiments of the invention.

Various embodiments of the invention may comprise hardware, software, and/or firmware. FIG. 7 illustrates an exemplary system 700 that may be used to implement various forms and/or portions of embodiments of the invention. Such a computing system may include one or more processors 62, which may be coupled to one or more system memories 61. Such system memory 61 may include, for example, RAM, ROM, or other such machine-readable media, and system memory 61 may be used to incorporate, for example, a basic I/O system (BIOS), operating system, instructions for execution by processor 62, etc. The system may also include further memory 63, such as additional RAM, ROM, hard disk drives, or other processor-readable media. Processor 62 may also be coupled to at least one input/output (I/O) interface 74. I/O interface 74 may include one or more user interfaces, as well as readers for various types of storage media and/or connections to one or more communication networks (e.g., communication interfaces and/or modems), from which, for example, software code may be obtained. Such a computing system may, for example, be used as a platform on which to run translation software and/or to control, house, or interface with an emulation system. Furthermore, other devices/media, such as FPGAs, may also be attached to and interact with the system shown in FIG. 7.

Figure 8:
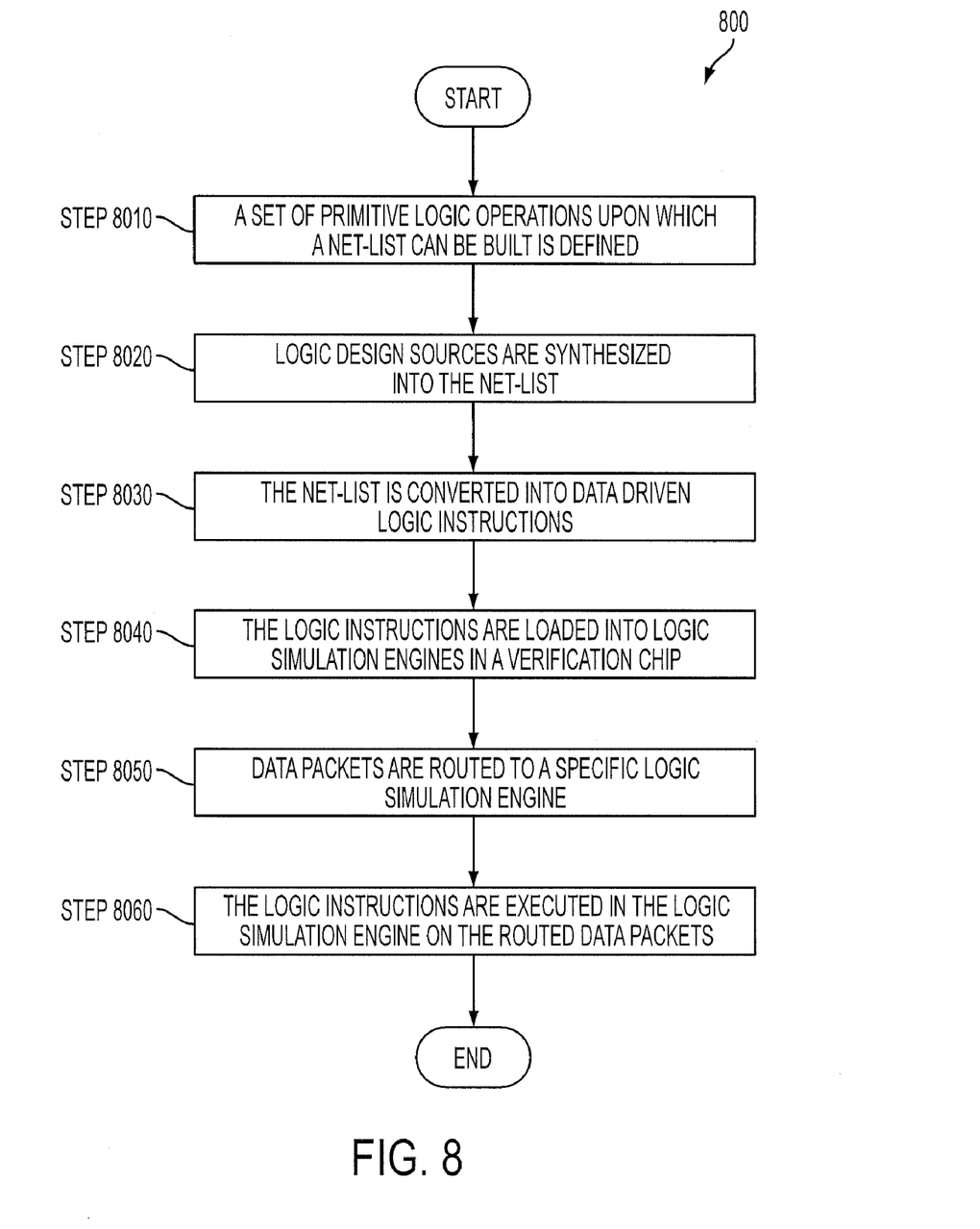
FIG. 8 illustrates a further embodiment of the invention.

FIG. 8 illustrates a further exemplary embodiment 800 of the present invention. First, a set of primitive logic operations upon which a net-list can be built may be defined 8010. Logic design sources may then be synthesized into the net-list 8020. The net-list may then be converted into data driven logic instructions 8030. The logic instructions may be loaded into logic simulation engines in a verification chip 8040. Data packets may be routed to a specific logic simulation engine 8050. The logic instructions may be executed in the logic simulation engine on the routed data packets 8060.

Although the present invention has been shown and described with respect to certain embodiments, it should be understood by those skilled in the art that various modifications can be made to the inventive apparatus and the method of the instant invention without departing from the scope and spirit of the invention.

What is claimed:

1. An apparatus for logic simulation, comprising:
   storage including a library to define how a net-list is to be synthesized by a synthesis tool;
   a data-driven logic verification chip comprising a plurality of logic processors, wherein the data-driven logic verification chip comprises a plurality of logic simulation engines, each of the plurality of logic simulation engines comprising:
      a routing unit, wherein the routing unit is configured to execute a routing algorithm wherein a header of a routed packet includes offsets in an X direction and a Y direction and the packet is determined to reach its destination when both offsets are equal to zero;
an instruction memory;
a respective one of the plurality of logic processors; and
a data memory; and
a code generator to adopt one or more heuristics to convert the net-list into data driven logic programs and to allocate hardware resources to balance computing and storage loads across the plurality of logic processors of the verification chip.

2. The apparatus of claim 1, wherein the library is configured to define a net-list to comprise a set of primitives selected from a group consisting of primitive gates, latches and memory units; wherein the library is further defined such that primitive gates are enabled to be implemented by logic instructions and executed by the plurality of logic processors of the verification chip.

3. The apparatus of claim 1, wherein the library includes a set of primitive logic operations upon which the net-list is enabled to be built by the synthesis tool, wherein primitive logic operations are mapped to logic instructions and executed by the plurality of logic processors of the verification chip.

4. The apparatus of claim 3, wherein a primitive logic operation of the library is configured to accept one or more inputs, wherein each of the inputs and an output of the primitive logic operation is a one bit signal.

5. The apparatus of claim 1, wherein the respective one of the plurality of logic processors is configured to execute all logic instructions in an active logic cell bundle, examine an output signal of the active logic cell bundle for changes and generate a triggering signal if the output signal is determined to have changed.

6. The apparatus of claim 1, wherein the respective one of the plurality of logic processors is configured for pipelined execution.

7. The apparatus of claim 1, wherein the data memory comprises:
a bundle number to indicate a number of logic cell bundles assigned to one logic simulation engine;
a plurality of bundle information records, each of the plurality of bundle information records to store a starting address and a length of logic instructions in one logic cell bundle and to store the current state of the logic cell bundle; and
a plurality of bundle data records, each of the plurality of bundle data records including inputs, outputs, double buffered latches and temporary data,
wherein a triggering message changes the inputs of a bundle data record and causes a state bit of an associated logic cell bundle to be set to active.

8. The apparatus of claim 7, further comprising a temporary data section including memory bits configured to be reused for combinatorial signals in the logic cell bundle by a heuristic register allocation algorithm when logic instructions are generated by the code generator.

9. The apparatus of claim 1, wherein the plurality of logic simulation engines are arranged in a mesh network.

10. An apparatus for logic simulation, comprising:
storage including a library to define how a net-list is to be synthesized by a synthesis tool;
a data-driven logic verification chip comprising a plurality of logic processors, wherein the data-driven logic verification chip comprises a plurality of logic simulation engines, each of the plurality of logic simulation engines comprising:
a routing unit;
an instruction memory;
a respective one of the plurality of logic processors configured to execute all logic instructions in an active logic cell bundle, examine an output signal of the active logic cell bundle for changes and generate a triggering signal if the output signal is determined to have changed; and
a data memory; and
a code generator to adopt one or more heuristics to convert the net-list into data driven logic programs and to allocate hardware resources to balance computing and storage loads across the plurality of logic processors of the verification chip,
wherein the triggering signal is transmitted locally in the logic simulation engine and remotely to other logic simulation engines, and
wherein the respective one of the plurality of logic processors is configured to be interrupted when an input signal is changed by a new triggering message, and the respective one of the plurality of logic processors is configured to restart execution at a first logic instruction of the logic cell bundle.

11. A method of logic simulation, comprising:
defining a set of primitive logic operations upon which a net-list is capable of being built;
synthesizing logic design sources into the net-list;
converting the net-list into data driven logic instructions;
loading the logic instructions into logic simulation engines in a verification chip;
routing data packets to a specific logic simulation engine, wherein the routing comprises:
moving data into and out of the logic simulation engine and relaying traffic passing by the logic simulation engine; and
routing data packets wherein a header of a routed packet includes offsets in an X direction and a Y direction and the packet is determined to reach its destination when both offsets are equal to zero; and
executing the logic instructions in the logic simulation engine on the routed data packets.

12. The method of claim 11, wherein the defining comprises defining logic instructions associated with logic cell bundles, each logic cell bundle being a group of primitive cells treated as an atomic execution unit.

13. The method of claim 11, wherein the executing comprises executing locally and remotely generated triggering events.

14. The method of claim 11, wherein the executing comprises:
executing all logic instructions in an active logic cell bundle;
examining an output signal of the active logic cell bundle for changes; and
generating a triggering signal if the output signal is determined to have changed,
wherein the triggering signal is transmitted locally in the logic simulation engine and remotely to other logic simulation engines, and
wherein a local processor is interrupted when an input signal is changed by a new triggering message and the logic processor restarts execution at a first logic instruction of the logic cell bundle.

15. A method of logic simulation, comprising:
defining a set of primitive logic operations upon which a net-list is capable of being built;
synthesizing logic design sources into the net-list;
converting the net-list into data driven logic instructions;

loading the logic instructions into logic simulation engines in a verification chip;

routing data packets to a specific logic simulation engine; and executing the logic instructions in the logic simulation engine on the routed data packets, wherein the executing comprises executing one logic instruction every cycle unless there is an external triggering message coming into the logic simulation engine and the external triggering message is competing for a write port of a data memory.

16. A non-transitory computer-readable medium having stored thereon executable code that, if executed, results in the implementation of operations comprising:

defining a set of primitive logic operations upon which a net-list is capable of being built;

synthesizing logic design sources into the net-list;

converting the net-list into data driven logic instructions;

loading the logic instructions into logic simulation engines in a verification chip;

routing data packets to a specific logic simulation engine, wherein the routing comprises:

moving data into and out of the logic simulation engine and relaying traffic passing by the logic simulation engine; and routing data packets wherein a header of a routed packet includes offsets in an X direction and a Y direction and the packet is determined to reach its destination when both offsets are equal to zero; and executing the logic instructions in the logic simulation engine on the routed data packets.

17. A non-transitory computer-readable medium having stored thereon executable code that, if executed, results in the implementation of operations comprising:

defining a set of primitive logic operations upon which a net-list is capable of being built;

synthesizing logic design sources into the net-list;

converting the net-list into data driven logic instructions;

loading the logic instructions into logic simulation engines in a verification chip;

routing data packets to a specific logic simulation engine; and executing the logic instructions in the logic simulation engine on the routed data packets, wherein the executing comprises executing one logic instruction every cycle unless there is an external triggering message coming into the logic simulation engine and the external triggering message is competing for a write port of data memory.

\* \* \* \* \*